United States Patent
Novellini et al.

(10) Patent No.: US 10,348,312 B1
(45) Date of Patent: Jul. 9, 2019

(54) CIRCUIT FOR AND METHOD OF IMPLEMENTING A BURSTY CLOCK AND DATA RECOVERY CIRCUIT USING AN EYESCAN DETECTION CIRCUIT

(71) Applicant: Xilinx, Inc., San Jose, CA (US)

(72) Inventors: Paolo Novellini, Gorgonzola (IT); Antonello Di Fresco, Abbiategrasso (IT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/993,508

(22) Filed: May 30, 2018

(51) Int. Cl.
*H03L 7/081* (2006.01)
*H03L 7/08* (2006.01)
*H03L 7/091* (2006.01)
*H04L 1/20* (2006.01)
*G11C 7/22* (2006.01)
*H04L 7/033* (2006.01)

(52) U.S. Cl.
CPC ............ *H03L 7/0807* (2013.01); *G11C 7/222* (2013.01); *H03L 7/081* (2013.01); *H03L 7/091* (2013.01); *H04L 1/205* (2013.01); *H04L 7/0331* (2013.01); *H03L 2207/06* (2013.01); *H03L 2207/50* (2013.01)

(58) Field of Classification Search
CPC ..... H04L 7/0338; H04L 7/0331; H04L 1/205; G11C 7/222; H03L 7/091; H03L 7/0807; H03L 7/06; H03L 7/081; H03L 7/0814; H03L 2207/06; H03L 2207/50
See application file for complete search history.

(56) References Cited

U.S. PATENT DOCUMENTS

| | | | |
|---|---|---|---|
| 6,963,643 B1 | 11/2005 | Lilliott | |
| 7,620,862 B1 | 11/2009 | Lai | |
| 7,730,244 B1 | 6/2010 | Ansari et al. | |
| 7,917,797 B2 | 3/2011 | Novellini et al. | |
| 8,666,010 B1* | 3/2014 | Novellini | H04L 7/02 327/147 |
| 8,681,919 B1 | 3/2014 | Novellini | |
| 8,724,764 B2 | 5/2014 | Guasti et al. | |
| 8,799,750 B1 | 8/2014 | Parekh | |
| 8,958,513 B1 | 2/2015 | Novellini et al. | |
| 8,971,468 B1 | 3/2015 | Novellini | |
| 9,130,807 B1 | 9/2015 | Novellini | |

(Continued)

OTHER PUBLICATIONS

Xilinx, Inc., "Burst Clock Data Recovery for 1.25G/2.5G PON Applications in UltraScale Devices", XAPP 1277 (v1.1), Nov. 14, 2016, Xilinx, inc., San Jose, CA USA.

*Primary Examiner* — Rahel Guarino
(74) *Attorney, Agent, or Firm* — John J. King

(57) ABSTRACT

A circuit for receiving data is described. The circuit comprises a phase detector circuit comprising a detector having a first input configured to receive a sum of an oscillator phase and a phase error, and a second input coupled to an output of a first sample selector; a second sample selector having an input coupled to receive the input data and generate output data; and an eye detection circuit comprising a third sample selector having an input coupled to receive the input data and a comparator for comparing outputs of the second sample selector and the third sample selector to determine how much an eye is open for a plurality of channels. A method of implementing a receiver is also described.

20 Claims, 7 Drawing Sheets

(56) References Cited

U.S. PATENT DOCUMENTS 9,143,316 B1 *  9/2015  Novellini .............. H04L 7/0331
9,331,724 B2    5/2016  Novellini et al.
9,378,174 B2    6/2016  Novellini et al.

* cited by examiner

CIRCUIT FOR AND METHOD OF IMPLEMENTING A BURSTY CLOCK AND DATA RECOVERY CIRCUIT USING AN EYESCAN DETECTION CIRCUIT

FIELD OF THE INVENTION

The present invention relates generally to integrated circuit devices, and in particular to a circuit for and a method of implementing a clock and data recovery circuit.

BACKGROUND OF THE INVENTION

A passive optical network (PON) is one of the technologies used to distribute internet data to customer premises. In a PON Network, all signals in the upstream direction (i.e. from clients to a Central Office (CO)) are passively combined before being received by the CO. A modem at the client side is called ONU (Optical Network Unit), while the device in the CO, which receives the combined data from multiple ONUs, is called OLT (Optical Line Termination). For the structure to work, only one ONU sends data at a given time, and all ONUs have to operate at the same exact frequency. The OLT receives one burst of data per ONU, and is in charge of synchronizing ONUs, via the downstream direction.

However, the channels between each ONU and the shared OLT can be different (e.g. different ONU types and different fiber lengths), and one of the weak aspects is the measurement of the upstream link quality. The parameters that are used in conventional devices when measuring the upstream link quality are the received optical power and the bit error rate (BER), which do not provide accurate upstream link quality measurements. Further, conventional techniques that rely upon optical power and the bit error rates will not provide information related to links not showing bit errors. That is, conventional techniques relying upon optical power and bit error rates may not detect link quality degradation over time, where channel degradation will not be detected before a link is actually showing bit errors.

Accordingly, there is a need for an efficient circuit for and a method of implementing a bursty phase detector in a receiver.

SUMMARY OF THE INVENTION

A circuit for receiving data is described. The circuit comprises a phase detector circuit comprising a detector having a first input configured to receive a sum of an oscillator phase and a phase error, and a second input coupled to an output of a first sample selector; a second sample selector having an input coupled to receive the input data and generate output data; and an eye detection circuit comprising a third sample selector having an input coupled to receive the input data and a comparator for comparing outputs of the second sample selector and the third sample selector to determine how much an eye is open for a plurality of channels.

A method of implementing a receiver is also described. The method comprises configuring a detector or a phase detector circuit to receive the sum of a controllable oscillator phase and the phase error at a first input, and an output of a first sample selector at a second input; coupling an input of a second sample selector to receive the input data and generate output data; and comparing, by an eye detection circuit, an output of the second sample selector and a third sample selector having an input coupled to receive the input data to determine how much an eye is open for a plurality of channels.

DETAILED DESCRIPTION OF THE DRAWINGS

The circuits and methods set forth below allow plotting the eyescan in bursty links, which are typical in Passive Optical Networks (PONs). According to some implementations, the eyescan capability, which is generally available for continuous links, is extended to bursty links. Because the eyescan capability of the circuits and methods set forth below can be implemented in logic in the fabric of a field programmable gate array (FPGA) for example compared to eyescan features available for continuous links which may require specific hardware, there is no need for changes in a serializer-deserializer (serdes) to perform the eyescan. That is, conventional eyescan functionality implemented in the serdes for non-busty data links, is not required for the circuits and methods set forth below, as only digital oversampled data is used. The circuits and methods allows detecting degrading client channels, which are not showing BER, before a client (i.e. an ONU) identifies bit errors.

Plotting the eye diagram between each ONU and the OLT provides a much higher quality way of measuring the upstream link quality compared to measurements based on BER and power measurement. The circuits and methods also allow comparing the quality of links that are not showing bit errors in the observation time, and enable detecting which link is better. The circuits and methods can also detect link quality degradation over time, alerting a system before a link is actually showing bit errors.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
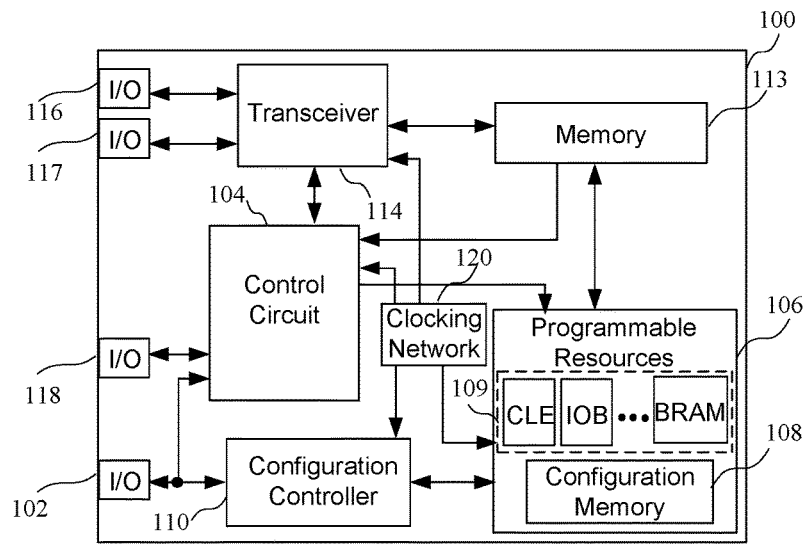
FIG. 1 is a block diagram of an integrated circuit having circuits for transmitting and receiving data.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109 and other programmable resources, such as input/output blocks (IOBs) and blocks of random access memory (BRAMs). Configuration data may be provided to the configuration memory 108 by a configuration controller 110. The configuration data enables the operation of the programmable resources 106. A memory 113 may be coupled to the control circuit 104 and the programmable resources 106. A transceiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. While the circuit of FIG. 1 is provided by way of example, the circuits for and methods of implementing a bursty phase detector can be implemented in different types of circuits.

Figure 2:
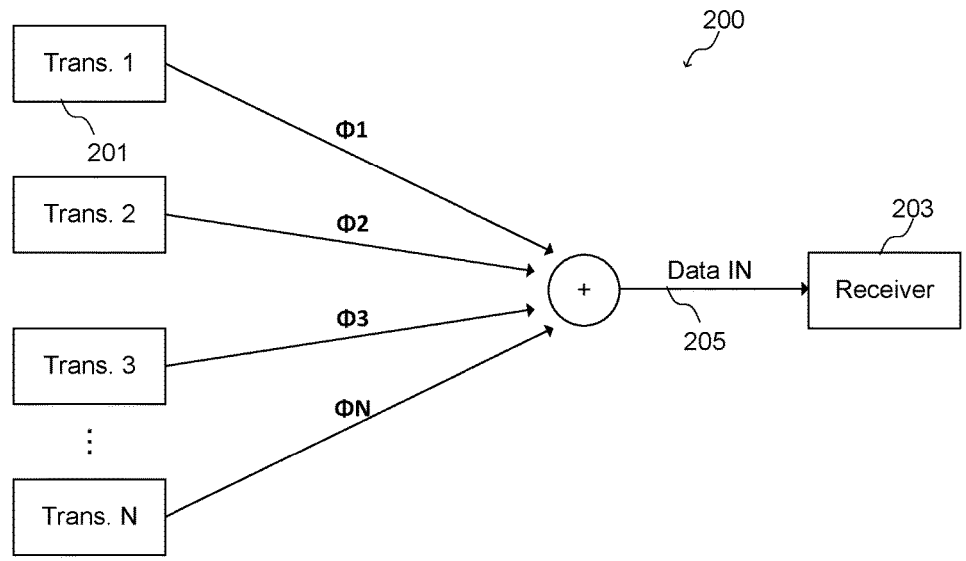
FIG. 2 illustrates an example of a bursty data system.
Figure 3:
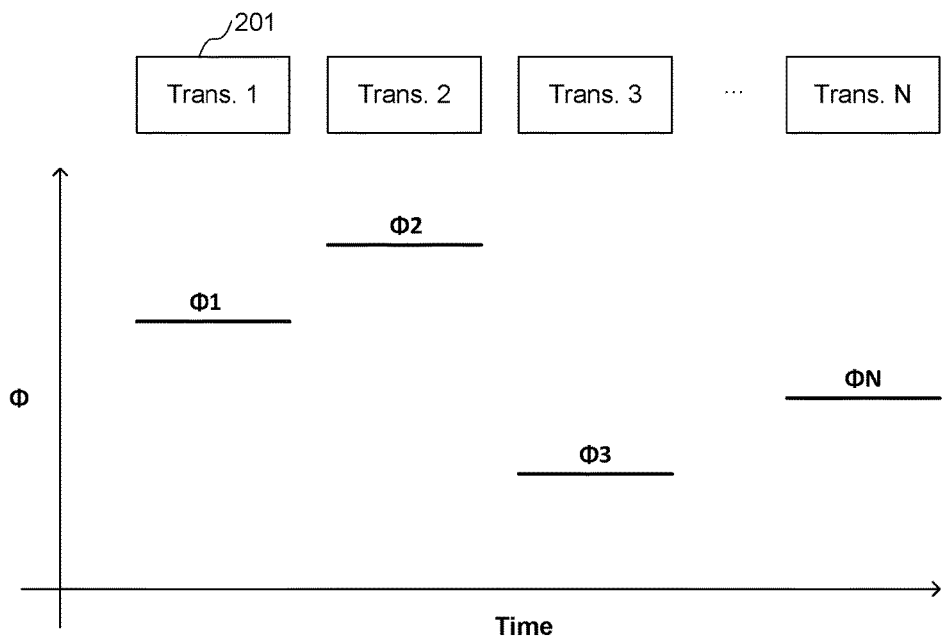
FIG. 3 illustrates an example phase profile for different clients of a bursty data system.

Turning now to FIGS. 2 and 3, an example of a bursty data system and an example phase profile for different clients of a bursty data system are shown. FIG. 2 is a block diagram illustrating an example bursty data system 200. Bursty data systems involve several transmitters 201 communicating with a single receiver 203 over a shared medium 205 using a technique known as time-sharing. In a bursty data system, different transmitters 201 are provided different time slots during which they can communicate exclusively with the receiver 203. The transmitters 201 in the bursty data system all transmit data at the same frequency, but different phases ϕ1, ϕ2, ϕ3, ϕN. FIG. 3 illustrates an example phase profile for different transmitters 201 of a bursty data system. As illustrated in FIG. 3, each transmitter 201 communicates exclusively with the receiver for a given period of time during which data is transmitted at a given phase.

For a receiver 203 to accurately process the data stream being transmitted by a transmitter 201, the phase of the data stream must be quickly detected in order for the receiver 203 to accurately sample data from the data stream. Acquiring the phase of the data stream allows the receiver 203 to sample data from the data stream at points where the signals representing the data stream are more reliable (e.g., less affected by local noise). The time it takes for the receiver 203 to detect the phase of the data stream and to begin accurately sampling the data using the detected phase relative to the start of data sampling is referred to as locking time. A goal of phase detection in a bursty data system is to minimize the locking time.

For data systems that are non-bursty in nature (e.g., one to one correspondence between transmitter and receiver), a phase-lockedloop (PLL) is used at the receiver to perform phase detection on incoming data. The PLL includes a phase detector that compares the incoming data stream to phase information output by an oscillator, such as a voltage-controlled oscillator (VCO) or a numerically controlled oscillator (NCO) for example, to generate an error phase of the data relative to the phase information output by the controllable oscillator. The error phase is fed back to the controllable oscillator, which updates its phase information to account for the error, and this process continues until the phase information output by the controllable oscillator is in sync with the data stream.

One technique for utilizing a PLL for a bursty data system involves appending a preamble to the beginning of a data stream being transmitted from a transmitter to the receiver. The preamble may be a fixed length of bits that are used by the receiver to perform phase detection prior to sampling the data stream. Although the PLL will eventually detect the phase of the data stream using the preamble, it does so very slowly, and as such a long preamble length may be required to ensure that the phase of the data stream is accurately detected before sampling of the data stream occurs. This technique may be undesirable for use within a bursty data system because it may require a long preamble length which may lead to an inefficient usage of bandwidth and a long locking time. Moreover, this technique fails to take into account that each transmitter is only allocated a fixed time segment within which its transmitted data stream must be sampled, and a long preamble may lead to too much of the time segment being utilized for phase detection.

Another technique involves utilizing dedicated custom circuitry in combination with a PLL for performing phase detection. A data stream is initially transmitted from a transmitter to the receiver with a preamble that includes a fixed pattern appended to the beginning of the data stream. Dedicated custom circuitry at the receiver is used to perform phase detection on the preamble and steer a voltage-controlled oscillator of the PLL in order to accurately sample the data stream. The size of the preamble is determined by the speed of the dedicated custom circuitry. By increasing the speed of the dedicated custom circuitry, the time it takes to detect the phase from the preamble can be decreased. Even though the locking time is reduced with this technique, it requires the use of dedicated custom circuitry operating at a very fast speed which can become quite costly. Moreover, even though preamble length can be reduced, a positive locking time may still be required in order to accurately perform sampling of the data stream. Another technique involves using a zero preamble length to perform phase detection on a data stream, but requires that the transmitters communicate with the receiver in a predictable cyclical manner.

Figure 4:
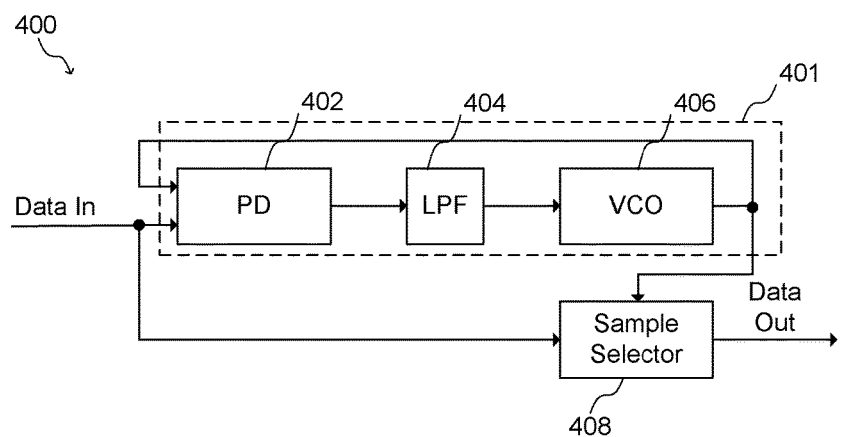
FIG. 4 illustrates a receiver and its application within a bursty data system.

Turning now to FIG. 4, a receiver and its application within a bursty data system is shown. A receiver 400 includes a phase-locked loop (PLL) 401 and a sample selector. The PLL 401 includes a phase detector 402, a low-pass filter 403, and a voltage-controlled oscillator 406.

The phase detector 402 includes a first input coupled to receive input data (Data In), also known as an incoming data stream, and a second input coupled to an output of the voltage-controlled oscillator 406. The phase detector 402 is configured to generate a phase error at its output.

The low-pass filter 404 includes an input coupled to the output of the phase detector 402 and an output coupled to an input of the voltage-controlled oscillator 406. The low-pass filter 404 is configured to remove local noise associated with the output of the phase detector 402 (e.g. phase error).

The voltage-controlled oscillator 406 includes an input coupled to the low-pass filter 404 and an output coupled to the phase detector PD as well as the sample selector 408. The voltage-controlled oscillator 406 generates a VCO phase at its output. While a VCO is shown by way of example in FIG. 4, it should be understood that an NCO could also be implemented.

Initially, an incoming data stream is received at the first input of the phase detector 402 of the PLL 401. The voltage-controlled oscillator 406 generates a random oscillator phase which is received at the second input of the phase detector 402 of the PLL 401. The phase detector 402 compares the phase of the incoming data stream to the oscillator phase generated by the voltage-controlled oscillator 406 to generate a phase error. The phase error is passed to the low-pass filter 922 which removes local noise before being received by the voltage controlled oscillator. The voltage controlled oscillator 406 generates an adjusted oscillator phase based on the received low-pass filtered phase error. This continues until the VCO phase generated at the output of the controllable oscillator 406 is aligned with the phase of the incoming data stream.

Figure 5:
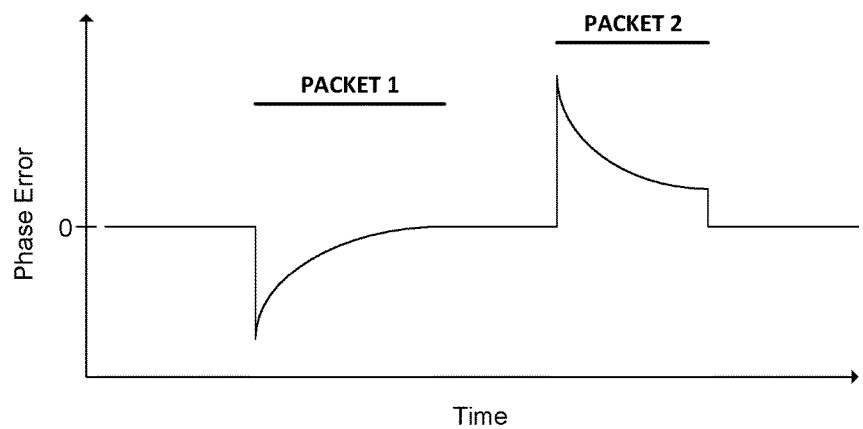
FIG. 5 illustrates the behavior of the PLL of FIG. 4.

Turning now to FIG. 5, the behavior of the PLL of FIG. 4 is shown. FIG. 5 illustrates the behavior for two different incoming data streams (i.e., packet 1 and packet 2) with different phases. Measurement points illustrate the phase error at the output of the phase detector 402 over time. As can be seen, when the incoming data stream is first received, a large phase error is generated by the phase detector due to the misalignment between the oscillator phase generated at the output of the voltage controlled oscillator 406 and the phase of the incoming data stream. As the oscillator phase is adjusted, the phase error grows smaller until the oscillator phase is aligned with the phase of the incoming data stream, at which point no error exists at measurement points.

While the PLL 401 is performing phase detection on the incoming data stream, the incoming data stream is simultaneously being received by the sample selector. The oscillator phase generated by the controllable oscillator 406 is transmitted to the sample selector to sample the incoming data stream and generate a data stream sample at its output. Because the oscillator phase is not initially aligned with the phase of the incoming data stream, the sample selector samples the incoming data unreliably and much of the incoming data stream may be lost. It is not until the controllable oscillator 406 generates a oscillator phase that is aligned with the phase of the incoming data stream that the incoming data stream is reliably sampled. In other words, a conventional receiver has a positive locking time (i.e., the time between the start of data stream sampling and the time at which the phase of the data stream is detected is positive) and as such incoming data may be lost due to the delay in detecting phase.

Figure 6:
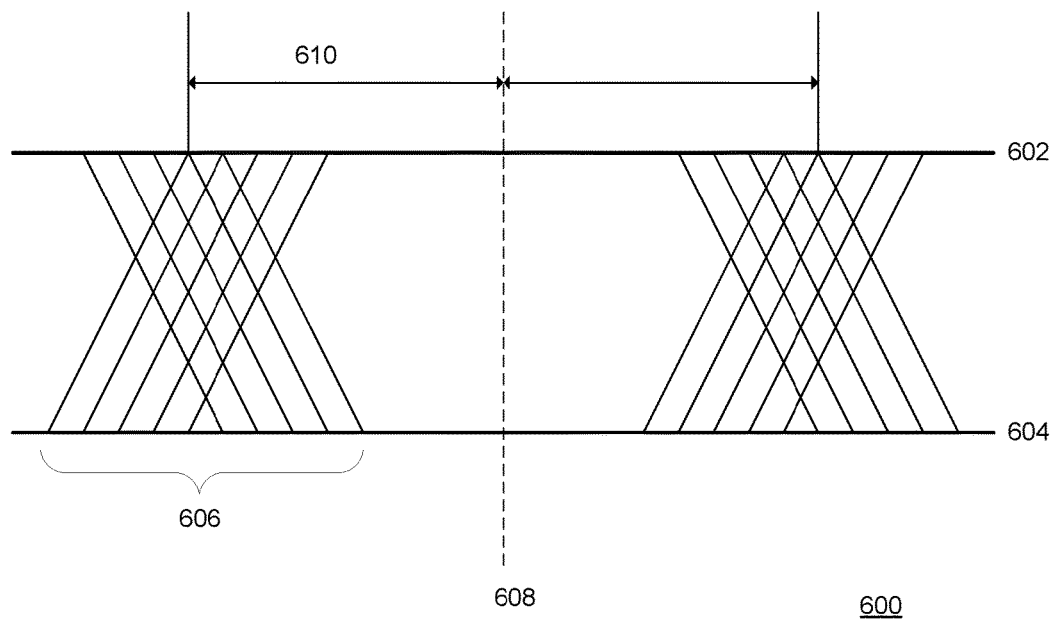
FIG. 6 illustrates an example of an eye diagram.

FIG. 6 illustrates an example of an eye diagram for an eye 600. In digital systems, the eye 600 is defined by high voltage level 602 and low voltage level 604, and the edges of the eye 600 are defined by the transitions 606 of the incoming data 201 (with jitter). During operation, a sample selector selects a sample at the center of the eye, represented by line 608, which is separated from the position of the edges (transitions 606) by margin 610. As long as the sample selector selects samples near the center of the eye (e.g., near line 608 in the example of the eye 600), the sampled data will be free of bit errors. However, if samples are taken closer to the edges of the eye 600 (e.g., near transitions 606), bit errors may be experienced. The amount of bit errors may increase the further the sample is from the center 608, due to the jitter of the incoming data.

In some cases, an eye scanner may be configured to perform an eye scan to determine a width of an eye (e.g., the eye 600). The eye scanner may include a phase shift module and a detector. To determine a width of the eye 600, the phase shift module may shift a sampling phase horizontally to either side of the eye 600. When the sampling phase is shifted near the edge of the eye (e.g., near transitions 606), bit errors may be detected by the detector of the eye scanner.

Thus, the margin 610 between the center of the eye (corresponding to line the 608) and the edges (corresponding to the transitions 606) may be determined by horizontally shifting the sampling phase to different positions, and measuring the occurrences of bit errors.

Figure 7:
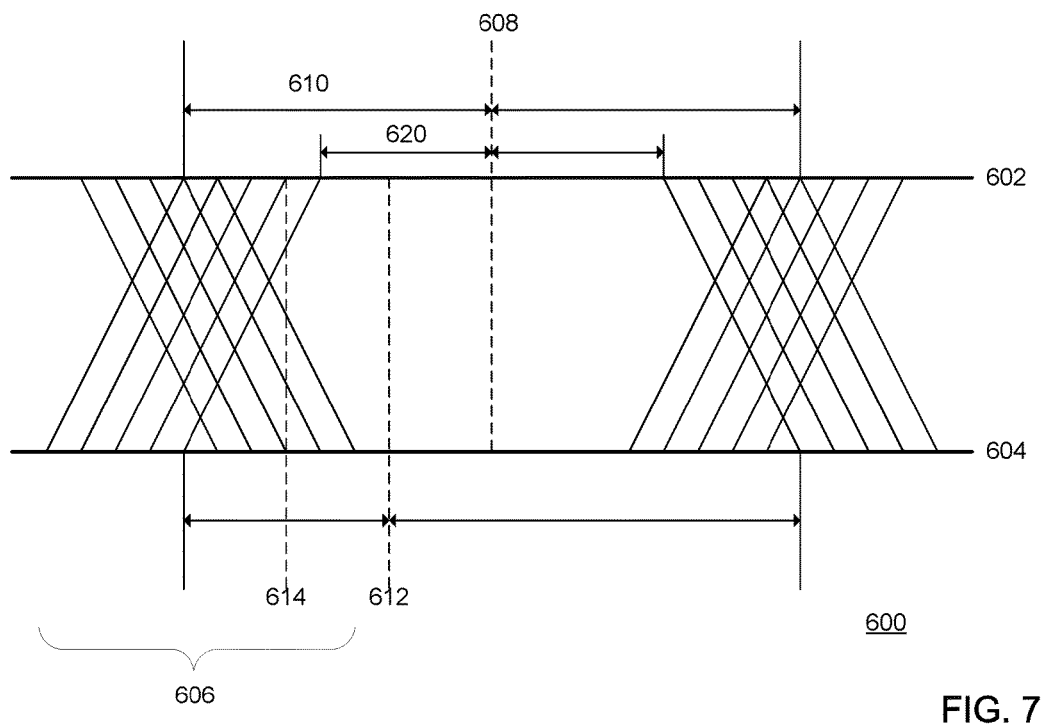
FIG. 7 illustrates another example of an eye diagram.

FIG. 7 illustrates shifting a sampling phase to determine a width of the eye 600. When the sampling phase shifter shifts the sampling phase to near the line 608, corresponding to the center of the eye, no bit errors will be detected by the detector. If the phase shift module shifts the sampling phase horizontally to near line 612, no bit errors will be detected by the detector despite the sampling phase being away from the line 608. This is because the sampling phase at the line 612 is still not near the transitions 606. However, if the phase shift module shifts the sampling phase to line 614, for example, bit errors will be detected by the detector, due to the sampling phase at the line 614 being within the range of transitions 606. In the illustrated example, the width of the eye 600 may be two times the distance 620 from the line 608 to the transitions 606 on one side of the eye 600. In another example, the width of the eye 600 may be the distance 620 from the line 608 to the transitions 606.

Figure 8:
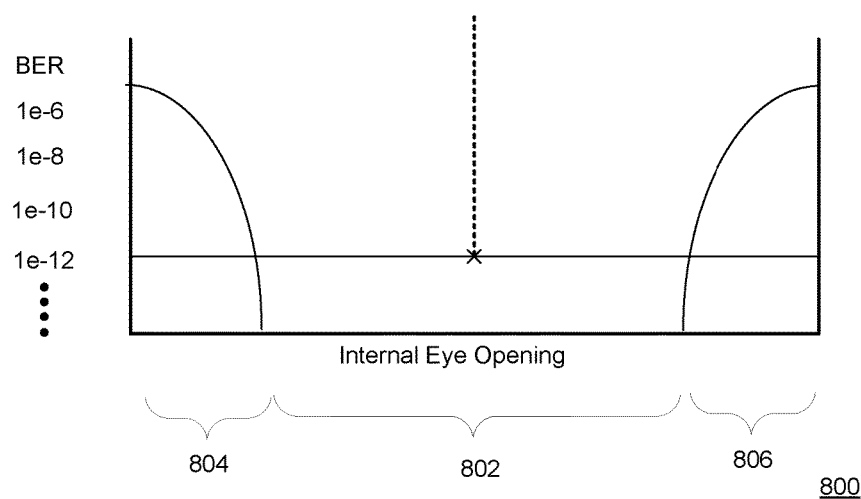
FIG. 8 illustrates a bit error rate graph.

In some cases, by shifting the sampling phase horizontally in both directions of an eye during the eye scan, a bit error plot may be obtained. FIG. 8 illustrates a bit error plot 800 that may be obtained by shifting a sampling phase in an eye. In some cases, the bit error plot 800 may be generated using a processor based on input from the phase shift module and the bit errors detector. The bit error plot 800 includes a central region 802 having no detected bit errors, corresponding to the region of the eye 600 away from the transitions 606 of the incoming data. The bit error plot 800 also includes regions 804, 806, which represent detections of bit errors at the transitions 606 of the incoming data. The horizontal line in the plot 800 represents 100% of the unit interval (UI). In the illustrated example, the width of the region 802 may be considered an example of a width of the eye. Accordingly, the width of the eye may be determined by measuring the bit error occurrences associated with different horizontal phase shifts. In some cases, the amount of bit errors measured at a particular sampling phase may be referred to as how open the eye is (e.g., an "openness" of the eye). For example, central region 802 of the eye may be referred to as being fully open, due to no bit errors being detected in that area of the eye.

Figure 9:
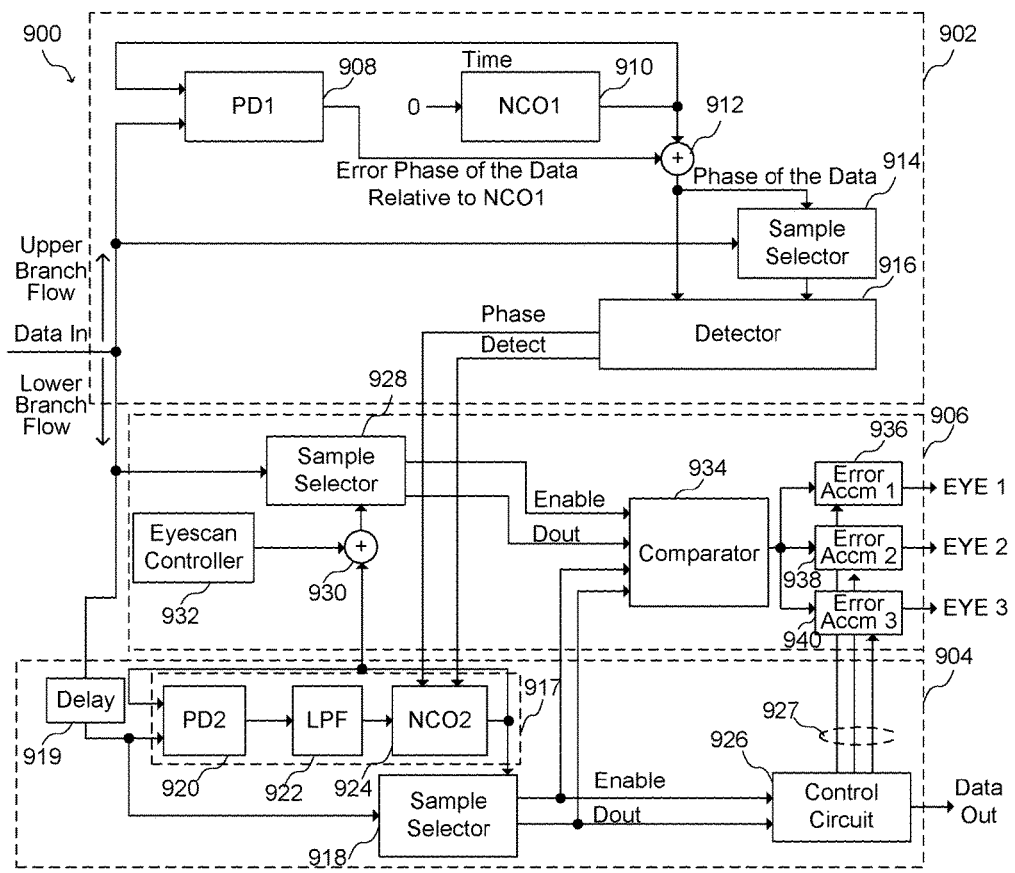
FIG. 9 illustrates a circuit for implementing a clock and data recovery circuit.

Turning now to FIG. 9, a circuit for implementing a clock and data recovery circuit is shown. The receiver 900 of FIG. 9 comprises a phase detector circuit 902, a sample circuit 904, and an eye detection circuit 906. The phase detector circuit 902 comprises a first phase detector 908 coupled to receive the input data (Data In) and a controllable oscillator 910, shown here by way of example as a numerically controlled oscillator (NCO). The phase detector 908 generates an error phase of the data relative to the output of the controllable oscillator 910, which is fed back to the phase detector 908. The output of the phase detector 908 and the controllable oscillator 910 is coupled to an adder 912, an output of which represents the phase of the input data. The phase of the input data generated at the output of the adder 912 is coupled a first sample selector 914 and a detector 916. The detector generates a preamble phase and a preamble detect signal, which are provided to the sample circuit 904.

The sample circuit 904 comprises a second sample detector 918 coupled to receive the input data and an output of a PLL 917 comprising a phase detector 920, a low pass filter 922 and a second controllable oscillator 924 also shown by way of example as an NCO. The second controllable oscillator receives the preamble phase and the preamble detect signals from the detector 916, and generates an output phase that is coupled to the sample selector 918. The outputs of the sample selector 918 are coupled to a control circuit 926 to generate the output data (Data Out). The control circuit 926 provides control signals 927 to the error accumulators 936-940, as will be described in more detail below.

The eye detection circuit 906 comprises a third sample selector 928 also coupled to receive the input data and an adder circuit 930 coupled to receive an output of the sample selector 928 and an output of the eyescan controller 932. A comparator 934 is coupled to receive outputs of the second sample selector 918 and outputs of a third sample selector 928 of the eye detection circuit 906, described in more detail below. At each clock cycle, the sample selector will select the samples that are more closely located to the middle of the eye. The number of samples extracted per clock cycle changes at each clock cycle. The Enable signal indicates to the next block how many bits are extracted in each clock cycle. The ratio between the line rate and the clock is fractional. As only an integer number of samples can be extracted per clock cycle, the number of extracted samples changes at each clock cycle so that, on average, the number of extracted samples is matching the line rate. The next block simply need to get all the extracted samples at each clock cycle. The data may be transmitted by a bus and at the same time the number of valid bits on the bus is transmitted. The comparator 934 generates a comparator output that is coupled to a plurality of error accumulators, shown here as a first error accumulator 936, a second error accumulator 938, and a third error accumulator 938 generating an eye opening measurement associated with first through third channels, designated as EYE 1, EYE 2, and EYE 3. The eye opening measurements can be determined as described above in reference to FIGS. 6-8. While 3 error accumulators are shown by way of example, it should be understood that any number of error accumulators could be implemented. Further, as will be described in more detail in reference to FIG. 10, additional eye detection circuits 906 could be implemented.

The phase detector circuit 902, also known as a bursty phase detector, performs phase detection on an incoming data stream and presets the phase of the PLL 917 to be aligned with the data stream prior to sampling by a sample selector. In this way, the receiver 900 of FIG. 9 is able to perform phase detection with a 0 or negative locking time, which will be discussed in further detail below. Optionally, the incoming data stream may include a preamble segment and a data segment.

The phase detector 908 of the phase detector circuit 902 includes a first input coupled to receive the incoming data stream and a second input coupled to an output of the controllable oscillator 910 of the phase detector circuit 902. The phase detector 908 of the phase detector circuit 902 is configured to generate a phase error at its output. The phase error is based on a comparison between the phase of the incoming data stream and a controllable phase output by the controllable oscillator 910 of the phase detector circuit 902. As will be discussed below, the controllable oscillator 910 of the phase detector circuit 902 is fixed and generates a fixed oscillator phase. As such the phase error generated by the phase detector 908 of the phase detector circuit 902 will be fixed. In some cases where the incoming data stream includes both a preamble segment and a data segment, the phase detector 908 of the phase detector circuit 902 may be configured to generate a phase error based on a comparison between the phase of the preamble segment and the VCO phase generated by the controllable oscillator 910 of the phase detector circuit 902. In other embodiments, the phase detector 908 of the phase detector circuit 902 may be configured to generate a phase error based on a comparison between the phase of the data segment and the phase generated by the controllable oscillator 910 of the phase detector circuit 902.

The controllable oscillator 910 of the phase detector circuit 902 is free-running and as such its input is tied to a fixed value 0. The output of the controllable oscillator of the phase detector circuit 902 is coupled to the adder. The controllable oscillator 910 of the phase detector circuit 902 is configured to generate a fixed oscillator phase at its output based on the fixed value tied to its input.

The adder 912 includes a first input coupled to the output of the controllable oscillator 910 of the phase detector circuit 902 (e.g., fixed VCO phase) and a second input coupled to the output of the phase detector 908 of the phase detector circuit 902 (e.g., fixed phase error). The adder combines the VCO phase and the phase error to generate the runtime phase of the incoming data stream at its output. In some cases where the incoming data stream includes both a preamble segment and a data segment, the runtime phase generated by the adder may be the runtime phase of the preamble segment. In other cases, the runtime phase generated by the adder may be the runtime phase of the data segment.

The sample selector 914 of the phase detector circuit 902 includes a first input coupled to an output of the adder, a second input coupled to receive the incoming data stream, and an output coupled to the signal stream detector. The sample selector 914 is configured to sample the incoming data stream using the runtime phase of the incoming data stream (e.g., combined oscillator phase and phase error) to generate a data stream sample at its output. In some cases where the incoming data stream includes both a preamble segment and a data segment, the data stream sample may be a sample of the preamble segment. In other cases, the data stream sample may be a sample of the data segment.

The signal stream detector 916 of the phase detector circuit 902 includes a first input coupled to an output of the adder and a second input coupled to the output of the sample selector 914. The signal stream detector is configured to generate an input data phase at a first output, shown here by way of example as a preamble phase, and an input data detect signal at a second output using the runtime phase of the incoming data stream (e.g. combined oscillator phase and phase error) as well as the data stream sample. The input data phase is the phase of the incoming data stream. The input data detect signal is an indication of the start of incoming data from a new transmitter. In some cases where the incoming data stream includes both a preamble segment and a data segment, the input data phase may be a preamble segment phase and the input data detect signal may be a preamble segment detect signal. In other embodiments, the input data phase may be a data segment phase. Optionally, the preamble segment may be used to trigger the input data detect signal.

During operation, incoming data streams enter the receiver 900 and flow into the upper branch as well as the lower branch. In the upper branch, the incoming data stream is detected and the phase of the incoming data stream is determined. The time it takes to detect the incoming data stream and to determine the phase of the incoming data stream is known as processing time. In the lower branch, the incoming data stream is stored in a delay element 919 until the upper branch detects the incoming data stream and determines its phase.

Once the signal stream detector 916 of the phase detector circuit 902 has detected the phase of the incoming data stream, the signal stream detector injects that phase into the controllable oscillator 924 of the PLL 917, such that the phase generated by the controllable oscillator 924 of the PLL 917 is aligned with the phase of the incoming data stream.

The phase detector 920 of the PLL 917 includes a first input coupled to receive the incoming data stream and a second input coupled to an output of the controllable oscillator 924 of the PLL 917. The phase detector 920 of the PLL 917 is configured to generate a phase error at its output.

The low-pass filter 922 includes an input coupled to the output of the phase detector 920 and an output coupled to an input of the controllable oscillator 924. The low-pass filter 922 is configured to remove local noise associated with the output of the phase detector.

The controllable oscillator 924 of the PLL 917 includes a first input coupled to the low-pass filter 922, a second input coupled to the input data phase signal generated by the signal stream detector, a third input coupled to receive the data stream detect signal generated by the signal stream detector, and an output coupled to the phase detector 920 of the PLL 917 as well as the data sample selector. The controllable oscillator 924 of the PLL 917 generates an oscillator signal having an oscillator phase at its output which is coupled to the second input of the phase detector 920 of the PLL 917 and the data sample selector. The controllable oscillator 924 of the PLL 917 generates the oscillator phase at its output based on the output of the low-pass filter 922 (e.g., phase error filtered to remove local noise), the input data phase, and the input data detect signal, as described in greater detail below.

Once the signal stream detector 916 in the upper branch has detected the phase of the incoming data stream, the signal stream detector 916 injects that phase into the controllable oscillator 924 of the PLL 917, such that the oscillator phase generated by the controllable oscillator 924 of the PLL 917 is aligned with the phase of the incoming data stream. Thus, when the phase detector 920 of the PLL 917 compares the phase of the incoming data stream to the oscillator phase generated by the controllable oscillator 924 of the PLL 917, a minimal phase error is generated. This minimal phase error is passed to the low-pass filter 922 which removes local noise before being received by the controllable oscillator 924 of the PLL 917. Because the low-pass filtered phase error is minimal, the controllable oscillator 924 of the PLL 917 continues to generate a oscillator phase that is aligned with the phase of the incoming data.

The data sample selector receives the incoming data stream from the output of the delay element 919 at the same time that the PLL 917 receives the incoming data stream. The data sample selector is also coupled to the output of the controllable oscillator 924 of the PLL 917 and uses the oscillator phase generated by the controllable oscillator 924 to sample the incoming data stream. Because the oscillator phase generated by the controllable oscillator 924 of the PLL 917 is aligned with the phase of the incoming data stream at the time the data sample selector begins receiving the incoming data stream, the incoming data stream is reliably sampled without any data loss.

Each data burst may start with a preamble, a fixed pattern having transitions, which is used by the bursty clock and data recovery (BCDR) circuit of FIG. 9 to quickly acquire lock, where the preamble does not carry any payload data. The oversampled data at the input goes through the upper branch, which detects the preamble and estimates its phase, which is the phase of the data burst which follows the preamble. The preamble phase, estimated by the upper branch, is injected in the lower branch, which can start extracting the data being already centered in the middle of the eye. The data delay of the delay element 919 in the lower branch accounts for the time needed by the upper branch to detect and estimate the preamble phase. Therefore, the lower branch can track the data phase as any standard CDR would; however, in presence of a phase step, it is quickly steered (e.g. in one clock cycle) to the new phase by the intervention of the upper branch.

The sample selector 918 receives the raw data samples and associates at each of them a phase, based on the input from the phase detector circuit 902, which may be a numerically controlled oscillator for example. The sample(s) which has the numerical phase closest to the middle of the eye is extracted. The sample selector 928 generally may have the same functionality as the sample selector 914, but extracts samples which are shifted in phase, compared to what is believed to be the middle of the eye.

The samples from the sample selector 918 and from the sample selector 928 are compared to determine how much the eye is open at a given phase. The eyescan controller 932 defines which phases inside the eye should be checked. Each time an error (i.e. a difference between samples from the two sample selectors) is detected, the accumulator relative to that a client (i.e. a link) is incremented. The control circuit 926 has knowledge of which ONU is active at a given time, and can thus enable the corresponding accumulator.

For each specific phase shift and each specific ONU, the accumulator (i.e. error accumulators 936-940) will hold the quality of the eye. The user will be able to control, through the eyescan controller, which ONUs to monitor and which phases to scan, and for how long. In general, the eyescan controller 932 will use multiple bursts from the same client to reach the required resolution and/or the required BER.

At the end of this process, each ONU will be qualified through its horizontal eyescan. The eyescan is non-disruptive, as this procedure can run any time, without affecting the data being transferred. Although this structure is suitable for passive optical networks, the circuits and methods can be applied to the general case where the medium is used in time sharing by many transmitters, and only one transmitter is active at a given time. By implementing control circuit 926, which has knowledge of which specific ONU is active at a given time, it is possible to implement a bursty phase detector in a network having time multiplexing, such as a passive optical network.

Figure 10:
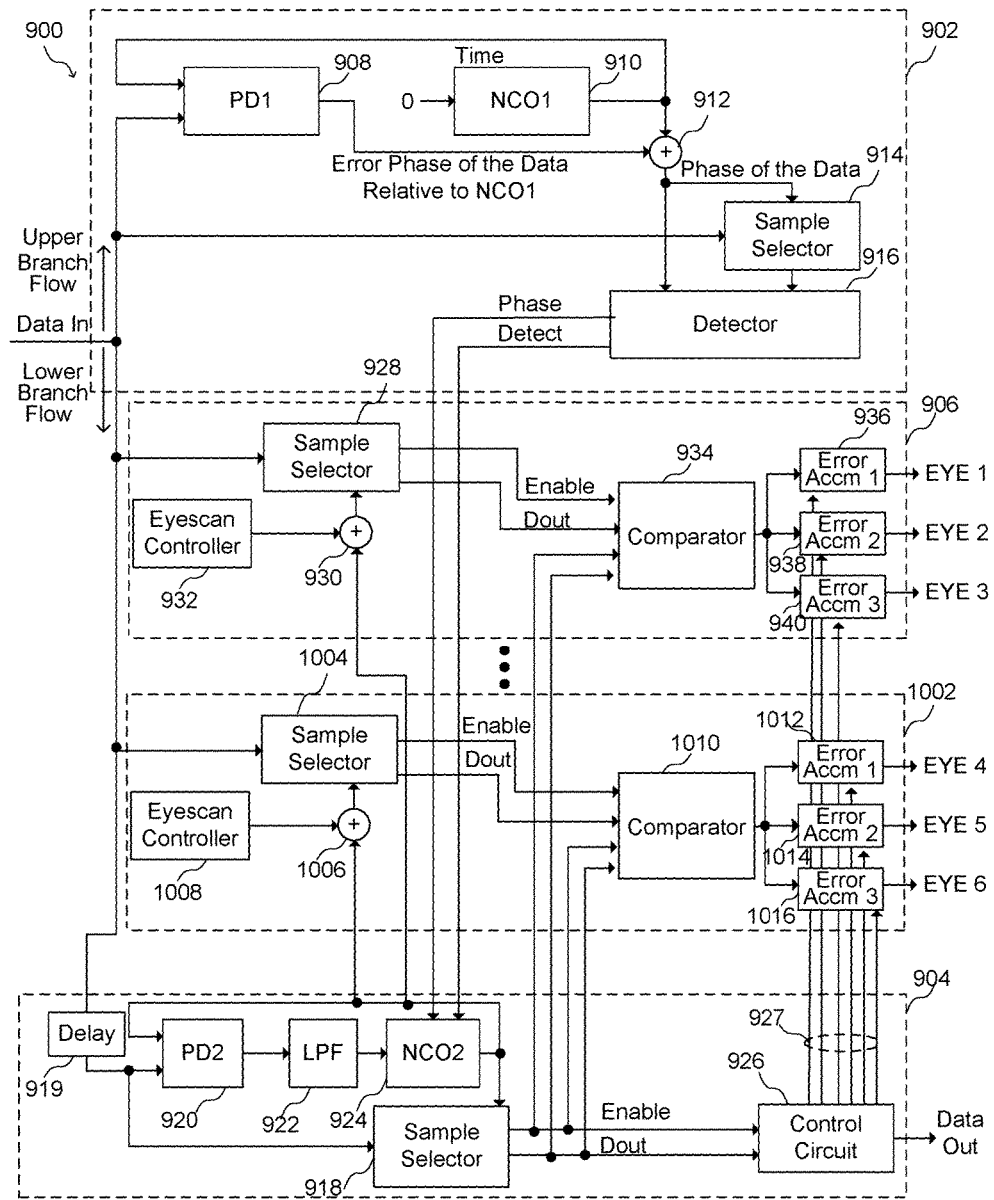
FIG. 10 illustrates another circuit for implementing a clock and data recovery circuit.

Turning now to FIG. 10, another circuit for implementing a clock and data recovery circuit is shown. More particularly, the implementation of FIG. 10 comprises a plurality of eye detection circuits 906, shown as additional eye detection circuit 1002. That is, more than 1 sample selector of an eye detection circuit can be implemented per sample selector 918. As shown in FIG. 10, the detection circuit 1002 comprises a fourth sample selector 1004 also coupled to receive the input data, and an adder circuit 1006 coupled to receive and output of the sample selector 1004 and an output of the eyescan controller 1008. A comparator 1010 is coupled to receive outputs of the second sample selector 918 and outputs of the fourth sample selector 1004 of the sample circuit 1002, described in more detail below. The comparator 1010 generates a comparator output that is coupled to a plurality of error accumulators, shown here as a fourth error accumulator 1012, a fifth error accumulator 1014, and a sixth error accumulator 1016 generating an eye opening measurement associated with fourth through sixth channels. Having more sample selectors of sample circuits operating at the same time reduces the time to calculate the eyescan. While 2 eye detection circuits 906 and 1002 are shown by way of example in FIG. 10, it should be understood that other numbers of eye detection circuits could be implemented.

Figure 11:
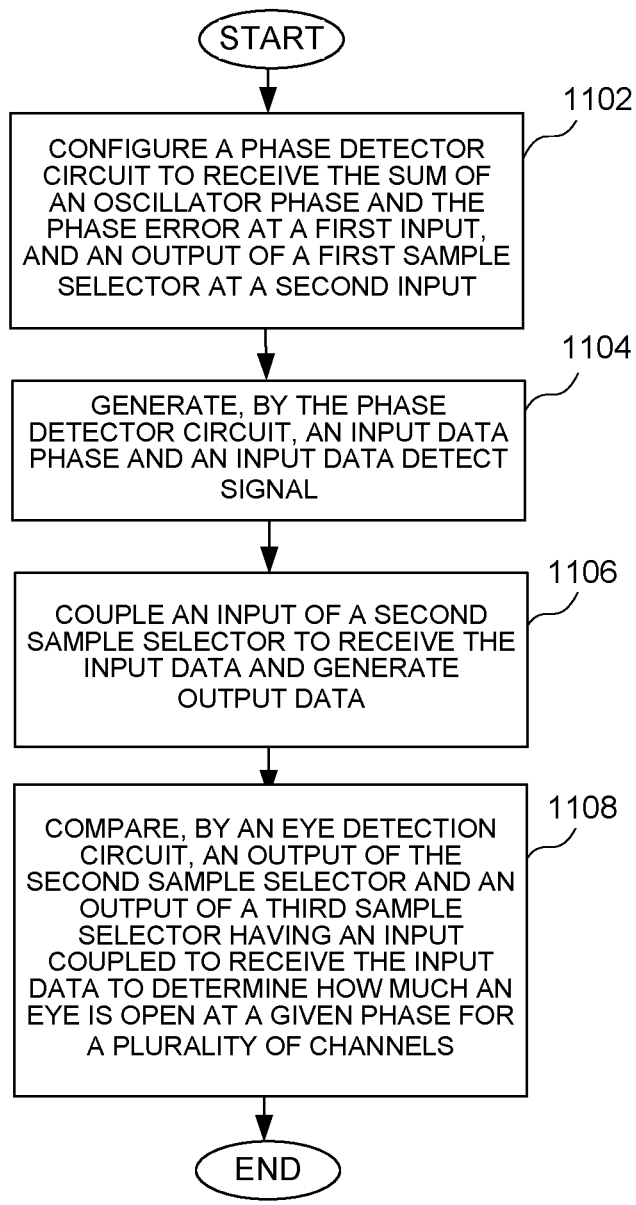
FIG. 11 is a flow diagram showing a method of receiving data.

Turning now to FIG. 11, a flow diagram shows a method of implementing a polar decoder. A phase detector circuit, such as phase detector circuit 902, is configured to receive the sum of the oscillator phase and the phase error at a first input, and an output of a first sample selector at a second input at a block 1102. An input data phase and an input data detect signal is generated by the data detector, such as by using detector 916, at a block 1104. An input of a second sample selector, such as sample selector 918, is coupled to receive the input data and generate output data at a block 1106. An output of the second sample selector is compared, by an eye detection circuit, to an output of a third sample selector, such as sample selector 928 having an input coupled to receive the input data to determine how much an eye is open at a given phase for a plurality of channels at a block 1108. The eye detection circuit could be implement and using eye detection circuit 906 for example.

The method may further comprise configuring a phase detector of the data detector to receive the input data and configuring an adder circuit to receive an output of the phase detector and a controllable oscillator to generate a phase of the input data. A preamble detector of the data detector may also be configured to receive an output of the adder and an output of the first sample selector.

The method of may further comprise configuring a phase detector to receive the input data and configuring a controllable oscillator to receive an output of the phase detector, wherein an output of the controllable oscillator is coupled to the third sample selector. A comparator of the eye detection circuit may be configured to receive an output of the second sample selector and the third sample selector.

A plurality of accumulators of the eye detection circuit, such as error accumulators 936-940, may be coupled to an output of the comparator, wherein each error accumulator of the plurality of error accumulators is associated with a corresponding channel of the plurality of channels. An output control circuit of the eye detection circuit, such as control circuit 926, may be coupled to each error accumulator of the plurality of error accumulators, where an eye scan controller of the eye detection circuit may be configured to control the second sample selector. The method may further comprise implementing an adder circuit of the eye detection circuit to receive a phase shift signal from the eye scan controller and an output of the second controllable oscillator.

The method of FIG. 11 may be implemented using the circuits of FIGS. 1-10 as described, or using some other suitable circuits. While specific elements of the method are described, it should be understood that additional elements of the method, or additional details related to the elements, could be implemented according to the disclosure of FIGS. 1-10.

It can therefore be appreciated that new circuits for and methods of implementing a bursty detector have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for receiving data, comprising:
    a phase detector circuit comprising a detector having a first input configured to receive a sum of an oscillator phase and a phase error, and a second input coupled to an output of a first sample selector;
    a second sample selector having an input coupled to receive input data and generate output data;
    an eye detection circuit comprising a third sample selector having an input coupled to receive the input data and a comparator for comparing outputs of the second sample selector and the third sample selector to determine how much an eye is open at a given phase for each channel of a plurality of channels; and
    a control circuit coupled to the eye detection circuit, wherein the control circuit provides control signals that enable the eye detection circuit to generate eye opening measurements for each channel of the plurality of channels.

2. The circuit of claim 1, wherein the phase detector circuit comprises an adder circuit configured to receive an output of a phase detector and an output of a controllable oscillator to generate a phase of the input data.

3. The circuit of claim 2, wherein the phase detector circuit is configured to generate an input data phase signal and an input data detect signal.

4. The circuit of claim 1, further comprising a phase detector configured to receive the input data and a controllable oscillator configured to receive an output of the phase detector, wherein an output of the controllable oscillator is coupled to the second sample selector.

5. The circuit of claim 4, wherein the eye detection circuit further comprises the comparator configured to receive the output of the second sample selector and the output of the third sample selector.

6. The circuit of claim 5, wherein the eye detection circuit further comprises a plurality of error accumulators coupled to an output of the comparator, wherein each error accumulator of the plurality of error accumulators is associated with a corresponding channel of the plurality of channels.

7. The circuit of claim 6, wherein the control circuit is coupled to each error accumulator of the plurality of error accumulators.

8. The circuit of claim 7, wherein the eye detection circuit further comprises an eye scan controller configured to control the third sample selector.

9. The circuit of claim 8, wherein the eye detection circuit further comprises an adder coupled to receive a phase shift signal from the eye scan controller and the output of the controllable oscillator.

10. The circuit of claim 1, further comprising a second eye detection circuit having a fourth sample selector having an input coupled to receive the input data and a second comparator for comparing outputs of the second sample selector and the fourth sample selector to determine how much an eye is open for a second plurality of channels.

11. A method of receiving data, comprising:
    configuring a detector of a phase detector circuit to receive a sum of a controllable oscillator phase and a phase error at a first input, and an output of a first sample selector at a second input;
    coupling an input of a second sample selector to receive input data and generate output data;
    comparing, by an eye detection circuit, an output of the second sample selector and a third sample selector having an input coupled to receive the input data to determine how much an eye is open at a given phase for each channel of a plurality of channels; and providing control signals that enable the eye detection circuit to generate eye opening measurements for each channel of the plurality of channels.

12. The method of claim 11, further comprising configuring an adder circuit to receive an output of a phase detector and a controllable oscillator to generate a phase of the input data.

13. The method of claim 12, further comprising generating, by the detector, an input data phase signal and an input data detect signal.

14. The method of claim 11, wherein further comprising configuring a phase detector to receive the input data and configuring a controllable oscillator to receive an output of the phase detector, wherein an output of the controllable oscillator is coupled to the second sample selector.

15. The method of claim 14, further comprising configuring a comparator of the eye detection circuit to receive the output of the second sample selector and the output of the third sample selector.

16. The method of claim 15, further comprising coupling a plurality of accumulators of the eye detection circuit to an output of the comparator, wherein each error accumulator of the plurality of error accumulators is associated with a corresponding channel of the plurality of channels.

17. The method of claim 16, further comprising generating eye opening measurements for each error accumulator of the plurality of error accumulators.

18. The method of claim 17, further comprising configuring an eye scan controller of the eye detection circuit to control the third sample selector.

19. The method of claim 18, further comprising an adder circuit of the eye detection circuit to receive a phase shift signal from the eye scan controller and the output of the controllable oscillator.

20. The method of claim 11, further comprising implementing a second eye detection circuit comprising a fourth sample selector having an input coupled to receive the input data and a second comparator for comparing outputs of the second sample selector and the fourth sample selector to determine how much an eye is open for a second plurality of channels.

* * * * *